United States Patent
Bott et al.

(10) Patent No.: US 12,241,288 B2
(45) Date of Patent: Mar. 4, 2025

(54) MODULE COMPONENT FOR A MOVABLE PART OF A VEHICLE AND A METHOD OF MANUFACTURING A MODULE COMPONENT

(71) Applicants: Huf Hülsbeck & Fürst GmbH & Co. KG, Velbert (DE); AUDI AG, Ingolstadt (DE)

(72) Inventors: Ingo Bott, Düsseldorf (DE); Andreas Beck, Bochum (DE); Florian Knubben, Essen (DE); Andreas Hoffmann, Wülfrath (DE); Thomas Popp, Vohburg/Irsching (DE); Thomas Liepold, Gaimersheim (DE)

(73) Assignees: Huf Hülsbeck & Fürst GmbH & Co. KG, Velbert (DE); AUDI AG, Ingolstadt (DE)

( * ) Notice: Subject to any disclaimer, the term of this patent is extended or adjusted under 35 U.S.C. 154(b) by 0 days.

(21) Appl. No.: 18/281,182

(22) PCT Filed: Mar. 9, 2022

(86) PCT No.: PCT/EP2022/056000
§ 371 (c)(1),
(2) Date: Sep. 8, 2023

(87) PCT Pub. No.: WO2022/189487
PCT Pub. Date: Sep. 15, 2022

(65) Prior Publication Data
US 2024/0151075 A1  May 9, 2024

(30) Foreign Application Priority Data
Mar. 10, 2021 (DE) .................... 10 2021 105 827.9

(51) Int. Cl.
*E05B 81/76* (2014.01)
*E05B 17/10* (2006.01)

(52) U.S. Cl.
CPC .............. *E05B 81/76* (2013.01); *E05B 17/10* (2013.01)

(58) Field of Classification Search
CPC ................................. E05B 81/76; E05B 17/10
See application file for complete search history.

(56) References Cited

U.S. PATENT DOCUMENTS

2007/0024420 A1    2/2007  Watanabe et al.
2009/0279826 A1*  11/2009  Ieda .................... G02B 6/0008
                                                      292/336.3

(Continued)

FOREIGN PATENT DOCUMENTS

DE    102013223730 A1    5/2015
WO    WO2019234225 A1   12/2019

*Primary Examiner* — Evan P Dzierzynski
*Assistant Examiner* — Jessica M Apenteng
(74) *Attorney, Agent, or Firm* — Bret E. Field; Bozicevic, Field & Francis LLP

(57) ABSTRACT

The invention relates to a module component (100) for a movable part (201) of a vehicle (200), comprising:
  a support housing (10) for fastening the module component (100) to the movable part (201) of the vehicle (200),
  a key device (20) for actuating the movable part (201) of the vehicle (200),
  wherein the key device (20) comprises a key cap (21) configured to receive an activation action, in particular a touch and/or force, of a user,
  wherein an activation element (24) is arranged on the key cap (21) to be able to detect a presence and/or an activation action of the user,
  and an electronic device (30) for providing lighting functions and/or sensor functions when the movable part (201) of the vehicle (200) is actuated, (Continued)

Figure 1:
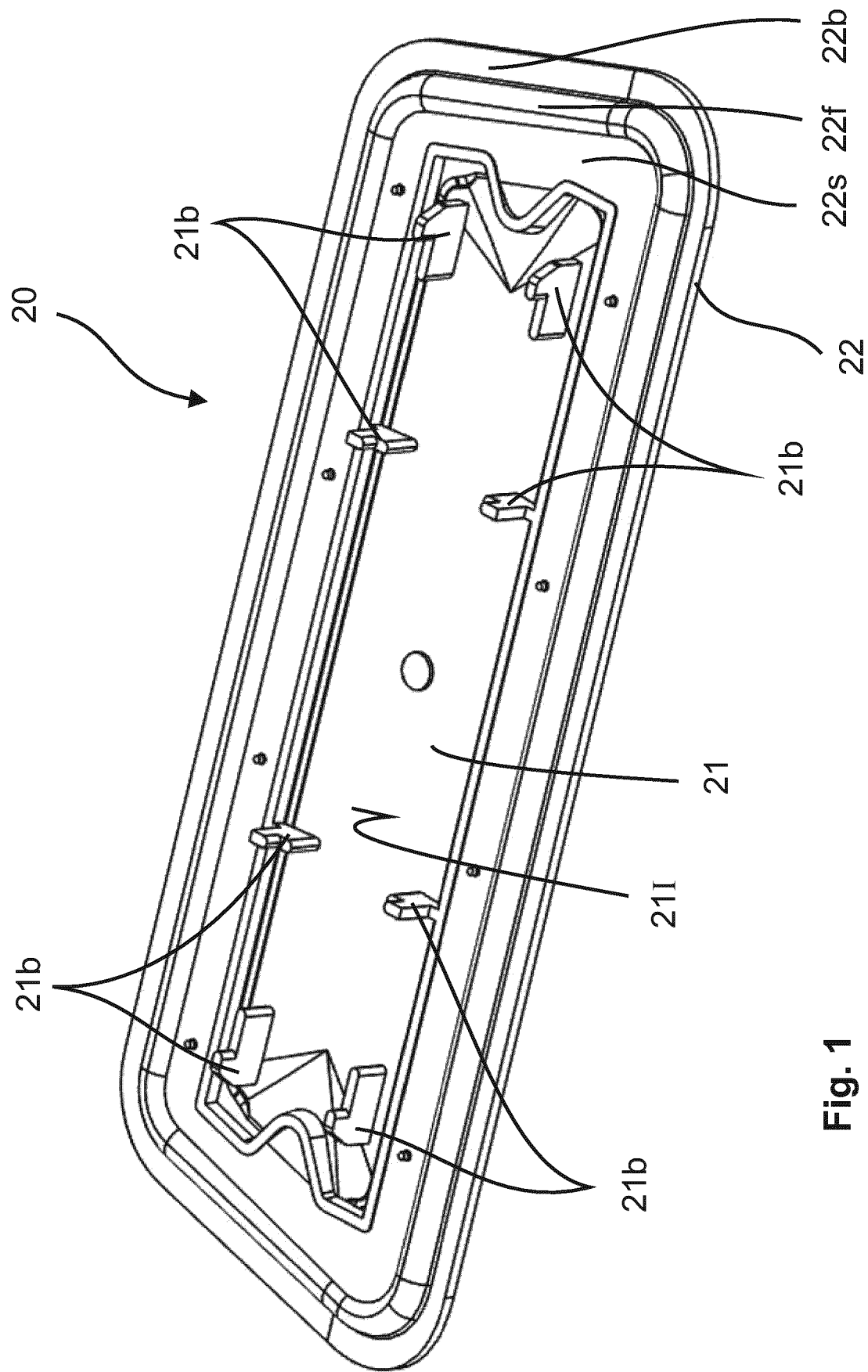

wherein the electronic device (30) is fastened to the support housing (10), wherein the electronic device (30) comprises a sensor device (31, 32) for a presence detection and/or an activation action detection at the activation element (24), and wherein the electronic device (30) comprises at least one lighting device (33) for illuminating through the key cap (21).

20 Claims, 7 Drawing Sheets

(56) References Cited

U.S. PATENT DOCUMENTS

| | | | |
|---|---|---|---|
| 2009/0284358 A1* | 11/2009 | Ieda | G07C 9/00944 |
| | | | 340/425.5 |
| 2011/0041409 A1 | 2/2011 | Newman et al. | |
| 2019/0376324 A1 | 12/2019 | Walawender et al. | |

\* cited by examiner

MODULE COMPONENT FOR A MOVABLE PART OF A VEHICLE AND A METHOD OF MANUFACTURING A MODULE COMPONENT

The invention relates to a module component for a movable part, such as a door or a flap, of a vehicle, for example in the form of a sensor device for a fixed handle, a grip recess or an outer skin of the movable part or for a component of the vehicle adjacent to the movable part, according to the preamble of the independent device claim, the module component being configured for actuating the movable part. The invention further relates to a method for manufacturing a module component according to the preamble of the independent method claim.

It is known from the state of the art that sensor devices, e.g. integrated in the handles, in the grip recess, in the outer skin of the doors or in the adjacent components to the doors, such as in the vehicle pillars, can be used to activate an electric lock of the vehicle and consequently to actuate a movable part of the vehicle. The unlocking of the lock can be enabled, for example, by an ID transmitter (identification transmitter), which transmits, for example a code to a security system of the vehicle for authentication purposes. It may also be possible that an activation, such as a wake-up of the ID transmitter and/or an unlocking or an opening of the lock, occurs only upon or after an approach and/or after an activation action of a user at a button. An activation action is detected in some handles or doors by inductive sensors. In known sensor devices for actuating a movable part of the vehicle, lighting devices are often used to make it easier to find sensor devices, in particular buttons, in a poorly lit environment.

It has been proven to be a disadvantage that sensor devices with separate lighting devices require more time and effort to install on the vehicle. Connecting sensor devices with separate lighting devices is also time-consuming. Another disadvantage of such sensor devices is the increased installation space. Furthermore, sensor devices with separate lighting devices require different manufacturing processes and strategies.

The invention is based on the object of at least partially overcoming the disadvantages described above. Furthermore, it is the object of the invention to provide an improved module component for a movable part, such as, for example, a door or a flap, of a vehicle, preferably in the form of a sensor devices with an illumination integrated in terms of function and circuitry for a fixed handle, a grip recess, for example in the case of a handleless movable part, and/or an outer skin of the movable part and/or for a component of the vehicle adjacent to the movable part, such as, for example, a B-pillar. In particular, it is the object of the invention to provide an improved module component for actuating a movable part of a vehicle which enables the functions of simple, intuitive and convenient use as well as recognizability of the module component. Preferably, it is the object of the invention to provide an improved module component for actuating a movable part of a vehicle, which can be manufactured and constructed simply and inexpensively, which can be handled and mounted simply, which can be connected simply, which has a reduced installation space and which has an extended, improved functionality.

The foregoing object is solved by a module component for a movable part having the features of the independent device claim and by a method for producing such a module component having the features of the independent method claim. Further features and details of the invention result from the respective dependent claims, the description and the drawings. Features and details described in connection with the module component according to the invention naturally also apply in connection with the method according to the invention and vice versa in each case, so that reference is or can always be made mutually with regard to the disclosure concerning the individual aspects of the invention.

The object is solved in particular by a module component for a movable part, such as a door or a flap, of a vehicle, preferably in the form of a modularly configured electronic device with a sensor device and an illumination device integrated in terms of function and circuitry, as well as a support housing for direct fastening to a fixed handle, a grip recess and/or an outer skin of the movable part and/or to a component of the vehicle adjacent to the movable part. The module component comprising:

- a support housing, which can also be referred to as an assembly support, for fastening the module component to the movable part of the vehicle, and in particular for movably supporting a key device and preferably for fastening an electronic device, comprising a sensor device integrated in terms of function and circuitry and a lighting device integrated in terms of function and circuitry,
- a key device for actuating the movable part of the vehicle,
- wherein the key device comprises a key cap, in particular a transparent key cap, which is configured to be able to receive an activation action, for example in the form of a touch and/or exertion of force, such as pressing, on the key cap, of a user, which means: to be able to receive it mechanically,
- wherein an activation element (meaning at least one), in particular comprises a conductive material, such as metal, is arranged on the key cap in order to be able to detect a presence and/or an approach and/or a certain movement pattern as well as an activation action of the user, meaning to be able to detect it sensorily,
- and an electronic device for providing lighting functions as well as sensor functions when actuating the movable part of the vehicle,
- wherein the electronic device is fastened to the support housing, in particular immovably relative to the support housing,
- wherein the electronic device having a sensor device, in particular integrated in terms of function and circuitry, for presence detection and/or activation action detection on the activation element,
- and wherein the electronic device comprises at least one lighting device, in particular integrated in terms of function and circuitry, for illuminating through the key cap.

The invention recognizes the problem of finding and/or recognizing key devices, for example in the dark, and proposes a combined module component with a modularly configured electronic device with an illumination device integrated in terms of function and circuitry and a sensor device as well as a support housing for direct fastening to a fixed handle, a grip recess and/or an outer skin of the movable part and/or to a component of the vehicle adjacent to the movable part. The one module component in the sense of the invention thus not only fulfils the sensor functions, but also the lighting functions. The lighting functions can advantageously be provided decoupled from the sensor functions, in particular even before the movable part is actuated, for example in the form of apron lighting, ambient lighting, etc. In addition, the module component according to the invention is configured to be coherent and compact in such a way that it can be handled as a single component, easily fastened to the vehicle and easily interconnected.

An activation action in the sense of the invention is in particular a touch and/or application of force, such as pressing, on the key cap and/or on a deformation region of the key cap. In particular the activation action takes place with contact.

In principle, the key cap can be moved and/or depressed and/or deformed as a whole or in part to receive the activation action. Advantageously, at least one specific deformation region on the key cap can be moved and/or depressed and/or deformed to receive the activation action. The key cap and/or the deformation region on the key cap can thereby execute an actuation path of approx. 0.01 mm to 0.05 mm, for example 0.02 mm.

The activation action preferably takes place on an outer side (outer surface) of the key cap that is accessible or reachable and graspable by a user of the vehicle during normal operation of the vehicle, for example when reaching behind into a grip recess.

Further, the key cap may be deformable to receive the activation action.

Further, the key cap may include at least one deformation region, which may be configured to be deformable to receive the activation action.

The activation action can be used to actuate the movable part. Actuation can be understood as unlocking, locking, opening and/or closing of the movable part. In particular, the activation action can, if further desired, serve to unlock and open the movable part. However, the functions for locking and/or closing the movable part can also be fulfilled with the aid of the module component according to the invention. The movable part can, for example, be configured as a door, e.g. a front door/side door and/or sliding door, or a flap, e.g. a tailgate, a fuel filler flap, a loading plug flap, of the vehicle. The vehicle may, for example, be formed as a motor vehicle, a passenger vehicle, and/or a truck.

The electronic device in the sense of the invention can preferably first detect a presence and/or an approach and/or a certain movement pattern of a user. For this purpose, a capacitive sensor device of the electronic device may serve (the activation element may serve as a capacitive electrode). Thereafter, the electronic device can initiate an identification check in the sense of the invention (for example, with the aid of an on-board communication device) and preferably directly switch on an illumination of the key cap. By switching on the illumination, the user can easily locate the key cap in order to actuate the key cap. After detecting an activation action on the key cap, an actuation of the movable part, in particular an unlocking and possibly an automatic opening, of the movable part can be initiated. For this purpose, the electronic device within the meaning of the invention can transmit corresponding control commands to an on-board control apparatus and/or an on-board lock.

The key cap can, for example, be arranged on a grip recess of a door handle-less movable part. The key cap can, for example, be concealed but can be sensed by reaching behind it in the grip recess, or it can be arranged so that it is directly visible, whether on a handle, a grip recess, an outer skin or an adjacent component. When illumination is turned on, the key cap may transmit light from the lighting device. In this regard, the key cap may be said to illuminate by having the at least one light source illuminate through the key cap. The key cap may further scatter, shape and/or align the light from the at least one light source in a particular manner. In the case of a concealed key cap, it may be advantageous to direct the light in the direction of the grip recess, for example downward toward the driving floor. In this case, it can be said, that the key cap provides indirect lighting.

In a module device, it is also possible for the activation element to comprise an electrically conductive material, e.g. metal, preferably aluminum or copper. The activation element can, for example, be in the form of an electrically conductive platelet, e.g. a thin copper platelet with a material thickness of approximately 0.1 mm to 0.5 mm, e.g. 0.2 mm, or an electrically conductive coating, e.g. on an inner side of the key cap. The activation element can be provided, for example, with a support plate having a material thickness of approximately. 0.2 to 2 mm, in particular 0.3 to 1.5 mm. The activation element can serve as a movable metallic element for inducing a measurable electric current in an inductive sensor device, for example in the form of an LDC sensor, for an activation action detection. Also, the activation element can serve as a capacitive sensor electrode for presence detection.

Advantageously, the key cap can comprise at least one deformation region in order to be able to receive an activation action, in particular a touch and/or application of force, of a user. In this case, the activation element can preferably be arranged on at least one deformation region of the key cap.

In addition, it is conceivable that the activation element is fastened to the key cap in order to be moved with the key cap as a whole and/or at least one deformation region on the key cap and to cause a measurable change in inductance in the sensor device by a movement of the activation element relative to the sensor device. For movable mounting, the key cap can be supported and preferably fastened to the support housing by, for example, a sealing element, in particular a compressible sealing element, as a resilient bearing element. With the aid of such a fastening, the key cap can be mounted on the support housing so that it can be easily pressed in. In principle, it is also possible that at least one deformation region of the key cap can be sufficient to receive the actuating action. In this case, movable mounting of the key cap can be dispensed through a compressible sealing element. In this case, the sealing element only serves to fasten the key cap to the support housing.

According to a further advantage, the activation element can be configured both for an activation action detection, in particular by at least one inductive sensor device, for example in the form of an LDC sensor, and for a presence detection, in particular by a capacitive sensor and/or by a capacitive evaluation device. For an activation action detection, the activation element moves together with the key cap and/or with at least one deformation region on the key cap relative to the inductive sensor device, for example in the form of an LDC sensor. For presence detection, the activation element serves as a capacitive sensor electrode. In this way, a compact sensor device can be provided that combines advantages of different sensor devices with different sensor technologies. In principle, however, it is also conceivable that the activation element can be configured only for activation action detection, in particular with the aid of an inductive sensor device, for example in the form of an LDC sensor. In this case, a separate detection element, for example in the form of a capacitive electrode, can be configured for presence detection, in particular a capacitive evaluation device.

Furthermore, in a module device it can be provided that the key cap is supported on the support housing, in particular from an outer side of the support housing, in particular movably relative to the support housing, and that the electronic device is fastened to the support housing, in particular from an inner side of the support housing, in particular immovably relative to the support housing, in such a way that an air chamber is formed between the key cap and the electronic device. Advantageously, the air chamber can be closed off and, in particular, sealed by attaching on the one hand the key cap and on the other hand the electronic device to the support housing (a sealing element can serve for sealing). In the air chamber, the light from the at least one lighting device can propagate before it enters the key cap, is guided through it, is possibly formed and/or scattered and/or aligned, and exits the key cap to the outside with respect to the air chamber (K). In this way, a protected mounting of the at least one lighting device can be made possible. Also, lighting functions with improved, individually adjustable properties can thereby be provided.

Furthermore, it can be advantageous if the activation element can be positioned between the key cap and the electronic device. In this way, the activation element can be moved in the air chamber relative to the electronic device.

The activation element may include a corresponding through hole for the at least one lighting device, or a corresponding through hole for each lighting device, to allow a light from the at least one lighting device to pass through to illuminate through the key cap.

Advantageously, several, for example two, activation elements can be arranged on the key cap in order to be able to detect the activation action of the user. In this way, the activation elements can be configured simply, in particular without through holes.

Advantageously, the activation element can be fastened to the key cap in such a way that the activation element is arranged at a distance from the electronic device. Due to the distance between the activation element and the electronic device, a relative movement of the activation element to the electronic device can be enabled to generate an inductance change, e.g. in at least one LDC sensor, preferably for detecting an activation action.

It is also advantageous that the activation element of the fastening of the key cap and/or of the electronic device of the support housing can be galvanically isolated from the electronic device. This can significantly facilitate the assembly of the module component.

It may be provided that the electronic device comprises a free-standing, resilient and/or flexible contact element, for example in the form of a leaf spring contact, for making electrical contact with the activation element, in particular in order to electrically connect the activation element to a capacitive sensor device, in particular in the form of a capacitive evaluation device. The contact element can serve to establish an electrical connection to the electronic device when the electronic device and the key cap are mounted on the support housing.

Advantageously, it can be provided that after the key cap and the electronic device have been fastened to the support housing, the activation element comes to rest resiliently on a free-standing contact element, for example in the form of a leaf spring contact, of the electronic device. In this way, electrical contact can be made between the activation element and the electronic device, for example with a capacitive evaluation device, preferably for presence detection.

Furthermore, in a module device it can be provided that the at least one lighting device comprises at least one or more lighting elements, for example in the form of LED elements. In this way, different lighting functions can be provided with low energy consumption.

In addition, in a module device it can be provided that the key cap comprises a lens structure on an inner side facing the electronic device, in particular one that is integrally formed, for example one that is co-molded, ablated or applied. Through the lens structure, the light from the at least one lighting device can be influenced, for example scattered, directed and/or aligned, and thus configured as desired and/or required.

It is also conceivable that the lens structure can comprise a serrated structure and/or grooved structure and/or cam structure. In this way, a simple and inexpensive lens structure can be provided. With the aid of such a lens structure, a scattering of the light can be effected.

Advantageously, the lens structure can be configured to scatter, direct and/or align a light from the at least one lighting device, for example in a direction towards a grip recess on the movable part of the vehicle. In this way, the lighting functions can be flexibly configured.

In a module device, it is also possible for the key cap to comprise a rough structure on an outer side facing away from the electronic device, in particular one that is integrally formed, e.g. co-molded, ablated or applied. In this way, the light, which may have previously been scattered by a lens structure and passed through the key cap, can again be diffusely scattered as it emerges from the key cap. In this way, a pleasant, soft illumination, for example of a grip recess, can be provided.

Furthermore, it is conceivable that the rough structure can be formed by roughening the outer side of the key cap. In this way, a simple and inexpensive rough structure can be provided.

Advantageously, the rough structure may be configured not only to scatter a light from the at least one lighting device, but also to provide a haptic tactile sensation for better haptic location of the key cap, in particular for easier palpation in a grip recess, when actuating the movable part of the vehicle.

Furthermore, in a module device it can be provided that the key cap, in particular at least in an unactuated position, is supported on the support housing in such a way that an outer side of the key cap extends essentially flush with or protruding (for example in the range of a few micrometers to a few millimeters) from an outer side of the support housing. A flush arrangement may allow for an unobtrusive appearance of the key cap. A protruding arrangement can make it easier to feel and thus find the key cap.

It is also conceivable that the key cap, in particular at least in an unactuated position, can be supported on the support housing in such a way that a circumferential gap is formed between an outer side of the key cap and an outer side of the support housing on the periphery of the key cap. This makes it easier to feel and thus find the key cap.

Advantageously, the area of the circumferential gap can be filled by a sealing element, in particular by a folding region of the sealing element, in order to seal an opening in the support housing and in particular to protect the electronic device from the effects of the weather, in particular from moisture. In other words, an air chamber between the key cap and the electronic device can thereby be sealed.

In a module device, it can also be provided that the sensor device comprises at least one or more inductive sensor devices, in particular arranged symmetrically to one another, for example in the form of LDC sensors, for detecting an activation action and/or a capacitive sensor device and/or a capacitive evaluation device for a presence detection on the activation element. With the aid of inductive sensors, the smallest movements in the range of a few micrometers to a few millimeters can be detected and evaluated sensitively and/or with high resolution. This means that an activation action can be detected even by a gentle touch of the key cap by a hand or finger of the user.

In a module device, it is also possible for the electronic device to comprise a control device. The control device can be used to provide advantageous functions of an access system to the vehicle, for example in the form of a keyless go and/or keyless entry system. Advantageously, the control apparatus can be operatively connected to a control device or directly to a lock of the vehicle in terms of control technology and/or communication technology. For the purpose of an identification check, the control device can be operatively connected to an on-board communication device, for example in the form of a radio device or an NFC device, in terms of control technology and/or communication technology, in order to verify the authorization of the user.

Furthermore, in a module device it can be advantageous that the control device can be brought into a communication connection with at least one on-board communication device, for example in the form of a radio device and/or an NFC device, which in turn can be brought into a signal connection with a mobile ID transmitter in order to carry out an identification check of the user. In this way, the control device can form part of an access system to the vehicle, for example in the form of a keyless-go and/or a keyless-entry system.

Furthermore, in the case of a module device, it can be advantageous that the control device can be brought into a communication connection with an on-board control apparatus and/or an on-board lock in order to initiate actuation of the movable part of the vehicle. Thus, the control device can be used to initiate the functions of actuating the movable part.

Furthermore, in a module device, it can be provided that the control device is configured to detect a presence detection of the user at the activation element by a capacitive sensor device and/or a capacitive evaluation device. A presence detection can be understood as a detection of a presence, an approach, a certain movement in a particular direction or even a certain movement pattern, for example from a distant zone to a closer zone. With the aid of the sensor device, it is thus possible to enable, advantageously, energy-saving monitoring of the exterior of the vehicle, for example at a distance of several meters or even several hundred meters. The presence detection can be used to detect a user in the vicinity of the vehicle and to switch on all other sensors and/or devices, which may require more energy, only after a presence detection.

Advantageously, the control device can be configured to activate the on-board communication device, preferably after a positive presence detection of the user at the activation element, in order to perform an identification check between an on-board communication device and an ID transmitter. In this way, the control device can be used to enable energy-saving operation of an access system to the vehicle.

Preferably, the control device can be configured to detect an activation action of the user at the activation element by at least one inductive sensor device after a positive identification check. After a positive activation action detection of the user at the activation element, the control device can initiate an actuation of the movable part of the vehicle accordingly.

Within the scope of the invention, it is conceivable in principle that the control device can be configured to switch on an illumination of the key cap, preferably after a positive presence detection and/or a positive identification check of the user at the activation element, in order to make it easier to find the key cap.

An opening for the key device can be provided on the support housing, through which inductive detection of an activation action can advantageously take place. For a simplified assembly of the module component, the support housing can comprise a trough-shaped seat for the key device. In this regard, the opening may be formed at a bottom of the trough-shaped seat. The key device, with the key cap, the activation element and the sealing element, can be easily and conveniently positioned in such a seat.

Advantageously, the key cap may be supported by an outer side of the support housing on the support housing, in particular on an opening in the support housing, to receive an activation action by a user through the opening in the support housing.

Furthermore, it is conceivable that the support housing can comprise positioning aids and/or centering aids for the key cap, in particular on an outer side, preferably on a trough-shaped seat. In this way, positioning of the key device can be further facilitated during assembly of the module component.

Advantageously, it is conceivable that a support plate can be provided for the activation element. The support plate can serve to mechanically stabilize the activation element, e.g. in the form of a thin metal platelet, and enable simplified mounting of the activation element on the key cap.

Furthermore, in a module device it can be provided that the support housing comprises, in particular on an inner side, a frame structure for the electronic device, wherein in particular the frame structure encloses the opening and in particular the key device on the peripheral side and in particular serves as a potting tray for potting the electronic device. With the aid of the frame structure, the electronic device can be easily and conveniently fastened to the support housing and, preferably, potted from the inside with respect to the outer surface of the key cap and thus fastened and sealed. For better positioning of the electronic device, the frame structure can border the opening and in particular the key device.

Advantageously, the electronic device can be arranged from an inner side of the support housing on the support housing, in particular at an opening in the support housing, preferably behind the key cap, and/or potted with a potting compound in order to fasten and/or seal the electronic device.

In addition, it is conceivable that the support housing can comprise positioning aids and/or centering aids for the electronic device, in particular on an inner side, preferably on a frame structure. In this way, positioning of the electronic device can be facilitated during assembly of the module component.

Furthermore, in the case of a module device, it can be provided that the support housing is an injection-molded component, and/or that the support housing comprises a dimensionally stable material, in particular plastic, preferably hard plastic, preferably thermoset. In this way, a simple, inexpensive and lightweight support housing can be provided for fasten the module component to the vehicle.

Furthermore, a module device can be provided with a sealing element arranged on the key cap to seal an opening in the support housing (by resting the key device on the opening) and, in particular, to protect the electronic device from the effects of weather. Thus, protection of the electronic device from moisture from outside the vehicle can be created. The sealing element can surround the key cap and come into contact with the opening in the support housing in a sealing manner.

Advantageously, the sealing element can also be configured to fasten the key cap to the support housing, preferably to an opening in the support housing, in particular through a laser welding process, and/or to support and/or support it in a movable manner (at least so that it can be pressed in slightly), in particular through the compressibility of the sealing element. In this way, the sealing element can fulfil several functions, such as: Sealing, fastening, and movably supporting. Thus, the key cap itself does not need to be configured to be deformable because the sealing element provides for the mobility of the key cap. The key cap can thus be manufactured simply and inexpensively. To detect an activation action, the sealing element can provide the necessary freedom of movement to push in the key cap.

According to a particular advantage, the sealing element can be configured to enable volume compensation, in particular in an air chamber, between the key cap and the electronic device. If volume changes occur in the air chamber due to temperature fluctuations and/or actuation of the key cap, the sealing element can compensate for these volume changes, for example by its elastic behavior, such as expansion and/or contraction. Advantageously, the sealing element can surround the key cap and, in particular, the opening in the support housing. To provide the volume compensation function, the sealing element can project slightly radially into the air chamber between the key cap and the electronic device.

In addition, the sealing element can comprise a fastening region, in particular on a shoulder region which is preferably on the outside and/or collar-shaped when viewed radially, in order to fasten the key cap to the support housing, in particular in a material-to-material bond, preferably by laser welding. Furthermore, the fastening region can be configured to be compressible in order to allow movement of the key cap relative to the support housing.

In addition, the sealing element may include a folding region to allow movement of the key cap relative to the support housing. Furthermore, the folding region may be configured to allow volume compensation, in particular in an air chamber, between the key cap and the electronic device. It is further conceivable that the folding region may comprise at least one fold, in particular substantially U-shaped, Ω-shaped and/or S-shaped, and/or may be bellows-shaped. The folding region can comprise at least one fold that can be drawn into the chamber when the volume in the air chamber is reduced, and/or that can be compressed in the chamber and/or displaced from the chamber when the volume in the air chamber is increased.

It can also be advantageous if the sealing element comprises a support region, in particular on a radially inner side, for fastening the sealing element to the key cap, in particular by material bonding, preferably by a 2-component injection molding process. It may be even more advantageous if the support region is configured to allow volume compensation, in particular in an air chamber, between the key cap and the electronic device.

Within the scope of the disclosure, it is conceivable that the sealing element and/or support plate for the activation element can comprise a volume compensation area, meaning integrally and/or in one piece and/or materially formed, in order to enable a volume compensation, in particular in an air chamber, between the key cap and the electronic device. In the case of a volume compensation area on the sealing element, this area of the sealing element can project into the air chamber between the key cap and the electronic device in order to provide volume compensation. In the case of a volume compensation area on the sealing element, this area may be formed on a support region and/or on a fastening region of the sealing element.

Furthermore, a module device can be provided with a, preferably separate, volume compensation element to enable volume compensation, in particular in an air chamber, between the key cap and the electronic device. It is conceivable that the volume compensation element can be arranged in the air chamber between the key cap and the electronic device.

Furthermore, in a module device, it can be provided that the key cap and the sealing element can be configured as a 2-component injection-molded component. This means that the key device can be manufactured simply and inexpensively.

Furthermore, in the case of a module device, it can be provided that the key cap and the sealing element or the seal element can be fastened to the support housing, preferably at a fastening region, by material bonding, in particular by laser welding. This enables simple mounting of the key device on the support housing.

In addition, in a module device, it can be provided that the key cap can comprise a dimensionally stable and/or transparent (meaning transparent to the light in the visible spectrum or at least to the light in the light spectrum of the at least one lighting device) material, in particular plastic, preferably polymer, preferably polyamide. In this way, the key cap can transmit light from the at least one lighting device to illuminate behind the key cap and, if desired, to illuminate a grip recess or other area on the movable part.

In addition, it can be provided in a module device that the sealing element can comprise an elastic material, in particular plastic, preferably elastomer, preferably thermoplastic elastomer. Thus, the sealing element can develop elastic properties to enable a movable mounting of the key cap on the support housing.

Furthermore, in a module device, it can be provided that the key cap comprises at least one positioning aid and/or centering aid and/or retaining elements for the activation element, in particular for a support plate for the activation element.

Furthermore, the key cap can comprise at least one, in particular hook-shaped or claw-shaped, fastening element for the activation element, in particular for a support plate for the activation element. The at least one fastening element can serve for fastening the activation element to the key cap, for example by hot caulking or ultrasonic welding of the at least one fastening element.

In this way, the activation element can be fastened to the, preferably at a distance from the inner side of the, key cap. This can be advantageous for a rigid activation element or an activation element with a support plate.

In addition, it is also conceivable that the activation element can be attached directly to the inner side of the key cap, for example in the form of a thin metallic layer, glued on, sprayed on, etc.

The object of the invention is further solved by a method of manufacturing a module component, which may be as described above, for a movable part of a vehicle, showing:
  Providing a support housing for fastening the module component to the movable part of the vehicle, and in particular for movably supporting a key device and preferably for fastening an electronic device, Providing a key device for actuating the movable part of the vehicle with a, in particular transparent, key cap and an, in particular electrically conductive, activation element, Support, e.g. movable support of the key cap, in particular from the outside (meaning the area of accessibility for the user when the module component is mounted on the vehicle), on the support housing for receiving an activation action, in particular a touch and/or an exertion of force, by a user, providing an electronic device for providing lighting functions and/or sensor functions when the movable part of the vehicle is actuated, comprising a sensor device for presence detection and/or activation action detection on the activation element and at least one lighting device for illuminating through the key cap, fastening an electronic device, especially from the inside (meaning the area that is inaccessible to the user when the module component is mounted on the vehicle), to the support housing.

With the aid of the method according to the invention, the same advantages can be achieved as described above in connection with the module component according to the invention. Full reference is made to these advantages.

The key cap can be fastened to the activation element, for example by hot caulking or ultrasonic welding, before or after the key cap is supported on the support housing.

The method may further provide that the support housing is manufactured by an injection molding process, and/or that the support housing is molded from a dimensionally stable material, in particular plastic, preferably hard plastic, preferably thermoset.

The method may further provide that the key device comprising a key cap and a sealing element is manufactured by a 2-component injection molding process, and/or that the key cap is molded from a dimensionally stable and/or transparent material, in particular plastic, preferably polymer, preferably polyamide, and/or the sealing element is molded from an elastic material, in particular plastic, preferably elastomer, preferably thermoplastic elastomer.

The method may further provide that the activation element is fastened to the key cap, in particular through a support plate, in particular by hot caulking or ultrasonic welding.

The method may further provide that the key cap with the sealing element is supported from an outer side of the support housing on the support housing, in particular at an opening in the support housing, and/or that the key cap is movably supported on the support housing by laser welding of the key cap and the sealing element or the seal element, preferably at a fastening region, to the support housing.

The method may further provide that the electronic device is arranged from an inner side of the support housing on the support housing, in particular at an opening in the support housing, preferably behind the key cap, and/or is potted with a potting compound to fasten and/or seal the electronic device.

The method can further provide that the key cap is supported on the support housing, in particular from an outer side of the support housing, and that the electronic device is fastened to the support housing, in particular from an inner side of the support housing, in such a way that an air chamber is formed between the key cap and the electronic device, and that the at least one lighting device comprising at least one or more light elements, for example in the form of LED elements, can emit a light into the air chamber which passes through the key cap.

The method may further provide that the key cap is provided, in particular formed, with an integral lens structure on an inner side facing the electronic device, wherein in particular the lens structure is formed with a serrated structure and/or grooved structure and/or cam structure to scatter, direct and/or align a light from the at least one lighting device, for example in a direction towards a grip recess on the movable part of the vehicle.

The method may further provide that the key cap is provided with an integral rough structure on an outer side facing away from the electronic device, in particular by roughening the outer side of the key cap, to scatter a light from the at least one lighting device and/or to provide a haptic tactile sensation for improved location of the key cap when actuating the movable part of the vehicle.

The steps/stages of the method according to the invention can be carried out in the given order or in a modified order.

Figure 2:
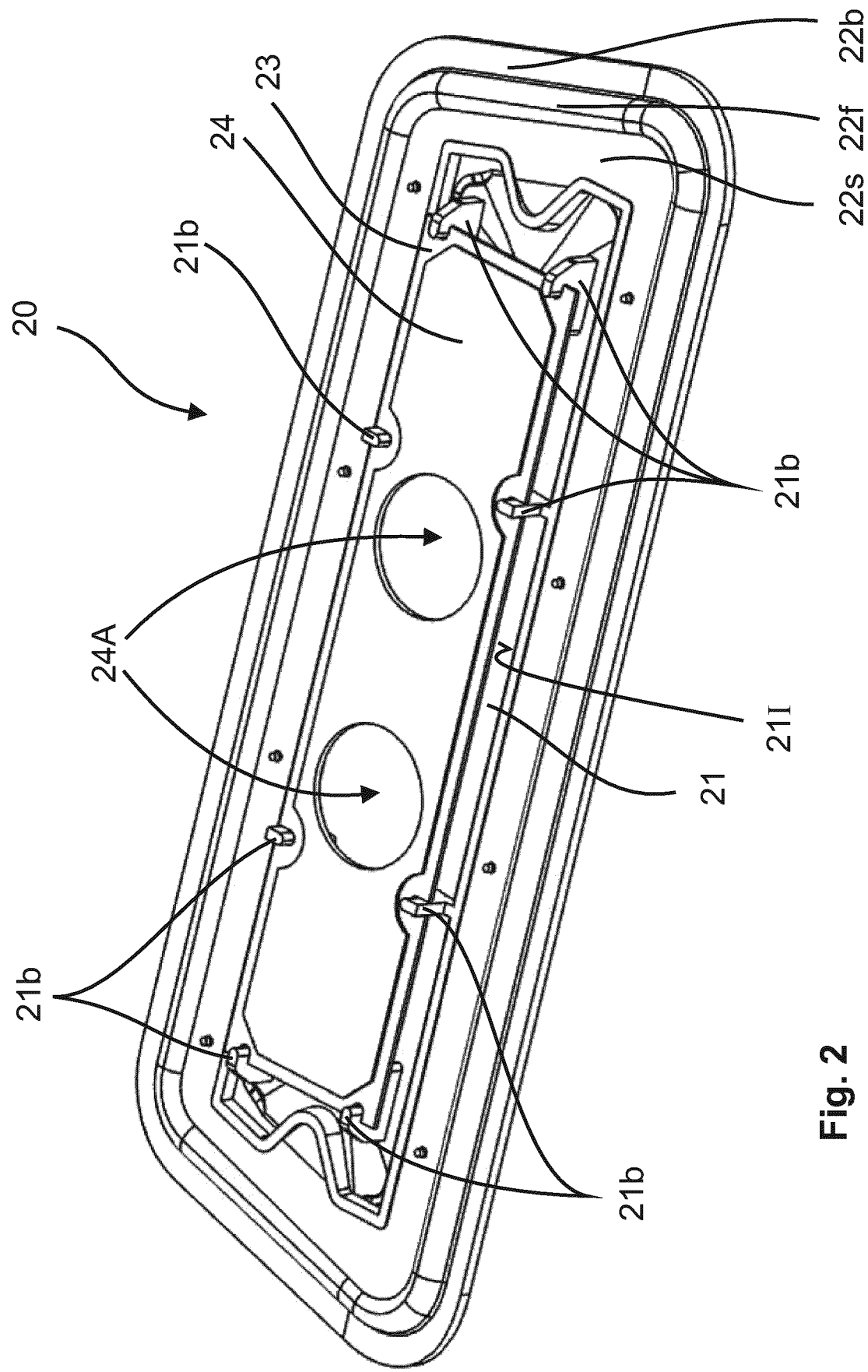
Figure 3:
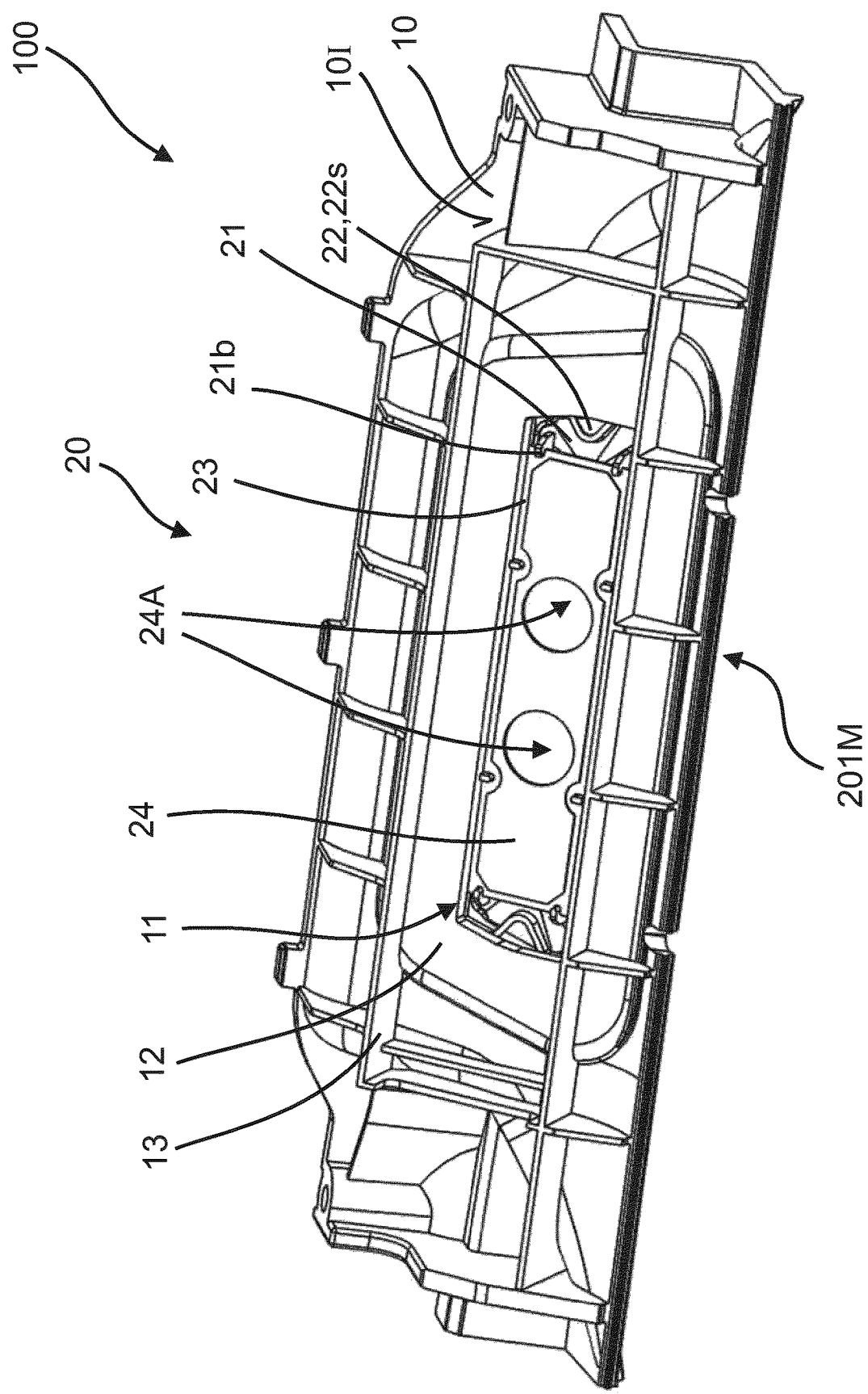
Figure 4:
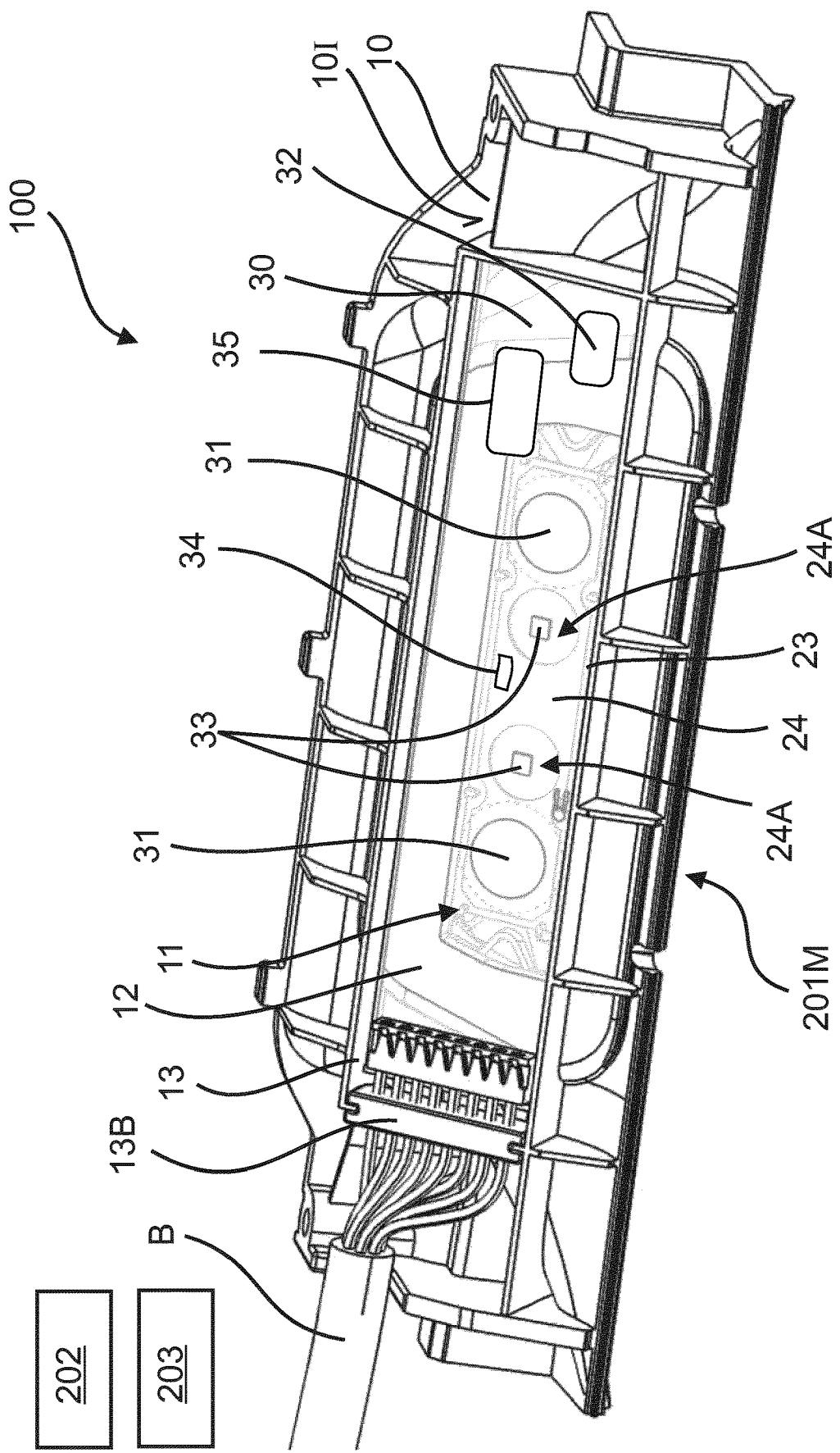
Figure 5:
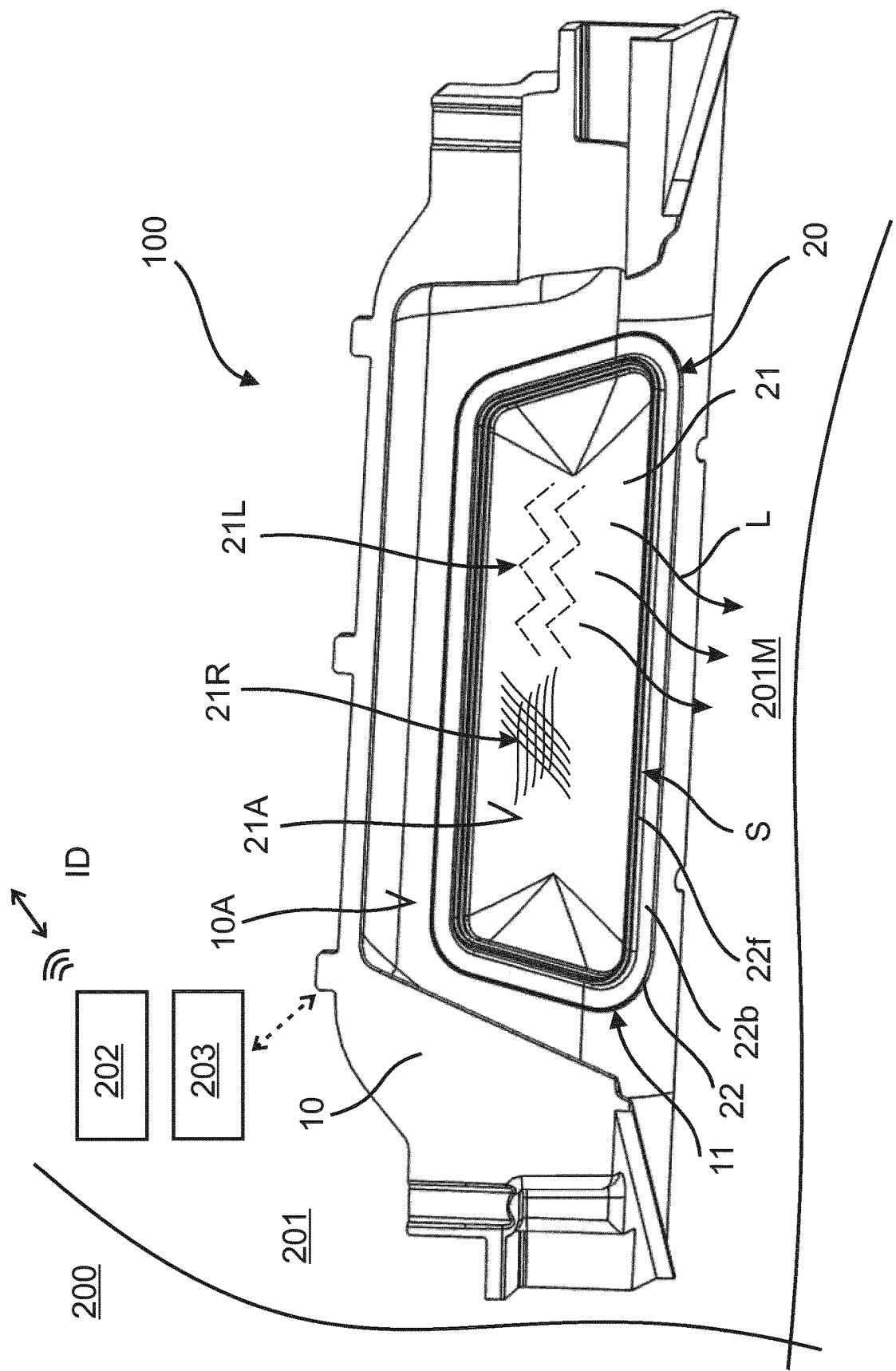
Figure 6:
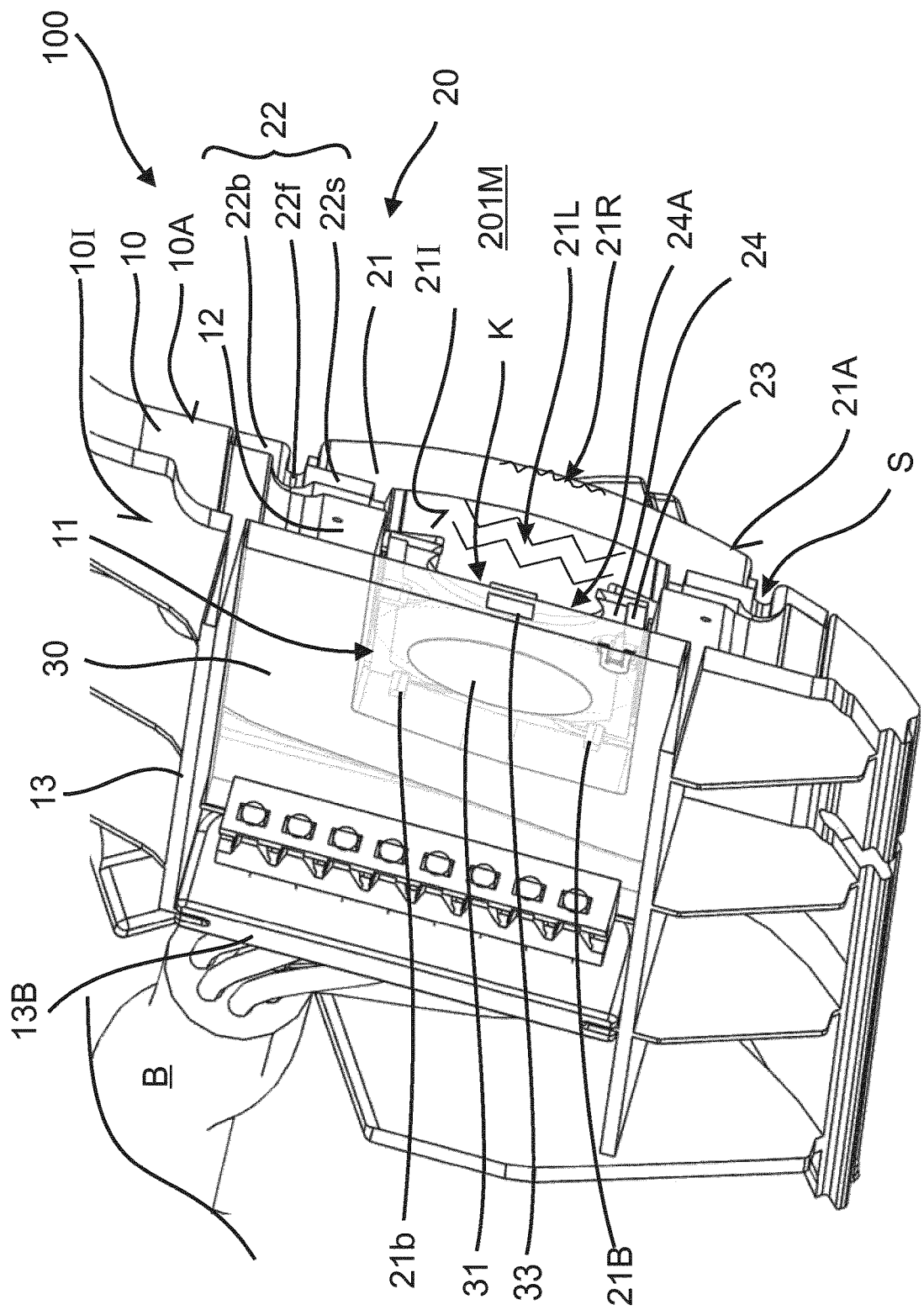
Figure 7:
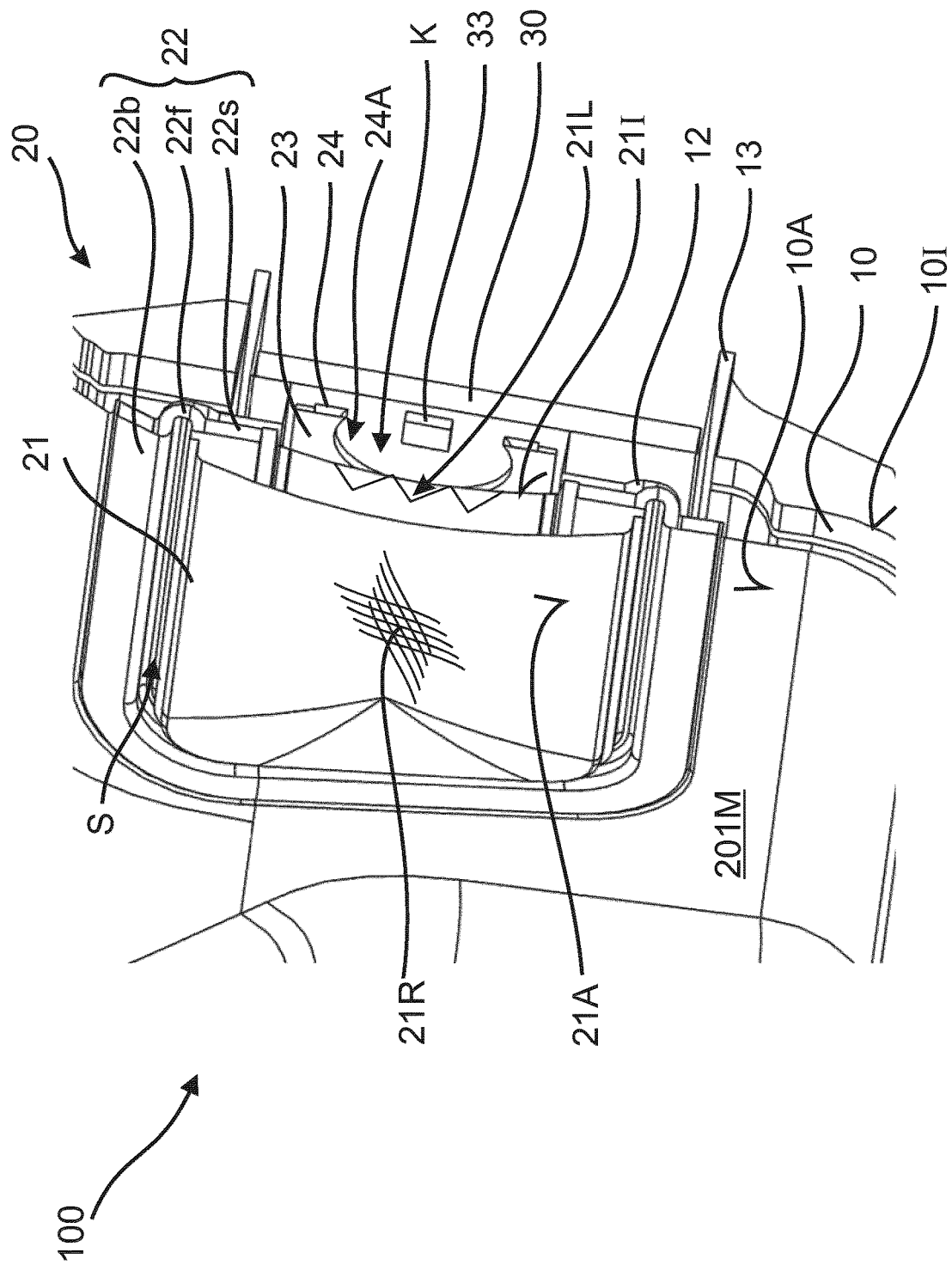

Further advantages, features and details of the invention will be apparent from the following description, in which embodiments of the invention are described in detail with reference to the drawings. In this connection, the features mentioned in the claims and in the description may each be essential to the invention individually or in any combination. Showing:

FIG. 1 a schematic view of an inner side of a key cap of a key device in the sense of the invention with an integrally formed sealing element, FIG. 2 a schematic view of an inner side of a key cap with an activation element of a key device in the sense of the invention, FIG. 3 a schematic view of an inner side of a support housing in the sense of the invention with a key device supported from behind at an opening in the support housing, FIG. 4 a schematic view of an inner side of a support housing according to the invention with a key device supported from the rear at an opening in the support housing and an electronic device supported from the front at the opening in the support housing, FIG. 5 a schematic view of an outer side of a support housing in the sense of the invention with a key device supported at an opening in the support housing, FIG. 6 a sectional view of a module component in the sense of the invention as seen on an electronic device, and FIG. 7 a sectional view of a module component in the sense of the invention as seen on a key device.

In the following figures, the identical reference signs are used for the same technical features, even from different embodiment examples. As a rule, the reference signs of the same embodiment examples are described only once.

FIGS. 1 to 7 serve to describe a module component 100 for a movable part 201 of a vehicle 200, as well as a manufacturing method for manufacturing such a module component 100.

The module component 100 is configured for actuating, i.e., unlocking, opening, locking, and/or closing, the movable part 201. A movable part 201 may be, for example, a door or a flap of the vehicle 200. The vehicle 200 as a whole is not shown in the figures merely for simplicity. The vehicle 200 or the movable part 201 of the vehicle 200 is only indicated in FIG. 5.

The module component 100 is configured as an individually manageable, coherent module component which, after assembly as a whole, can be mounted at an intended location on the vehicle 200. The module component 100 preferably serves as an electronic device of modular configuration with sensor devices 31, 32 integrated in terms of function as well as circuitry and a lighting device 33, which can also be referred to as an illumination device, as well as a support housing 10 for direct fastening of the module component as a whole. Within the scope of the invention, it is conceivable that the module component 100 can be fastened to a fixed handle, a grip recess 201M and/or an outer skin of the movable part and/or to a component of the vehicle 200 adjacent to the movable part 201.

In one aspect, the module component 100 includes:
a support housing 10 shown in FIGS. 3 through 7.

The support housing 10 may also be referred to as an assembly support. The support housing 10 is configured for fastening the module component 100 to the movable part 201 of the vehicle 200. In addition, the support housing 10 is configured for movably supporting a key device 20 (cf. FIG. 3) and preferably for fastening an electronic device 30 (cf. FIG. 4), comprising a sensor device 31, 32 integrated in terms of function and circuitry and a lighting device 33 integrated in terms of function and circuitry.

The module component 100 includes, in another aspect:
a key device 20 for actuating the movable part 201 of the vehicle 200, which is shown in a stand-alone position in FIGS. 1 and 2.

The key device 20 is further shown in FIG. 3, wherein in the view of FIG. 3, the key device is supported at an opening 11 in the support housing 10.

The key device 20 comprises a key cap 21, in particular fixed or dimensionally stable and transparent (for light in the visible spectrum or at least for light in the light spectrum of at least one lighting device 33), which is configured to be wholly or partially movable relative to the support housing 10. The key cap 21 may be fastened to the support housing 10 by a sealing element 22. The sealing element 22 may further be compressible and/or serve as a resilient bearing element. The key cap 21 serves to be able to mechanically receive an activation action of a user, for example in the form of touching and/or applying force, such as pressing, to the key cap 21. The key cap 21 may be configured to be deformable as a whole or in part for receiving the activation action. Advantageously, the key cap 21 may comprise at least one deformation region. An actuation movement of approx. 0.01 mm to 0.02 mm can be sufficient to receive the activation action.

As shown in FIGS. 2 and 3, at least one activation element 24 is arranged on the key cap 21. In principle, it is conceivable that several activation elements 24 may be provided on the key cap 21. The activation element 24 may, for example, comprise a conductive material, such as metal. The activation element 24 serves, on the one hand, to be able to detect a presence and/or an approach and/or a specific movement pattern of a user through sensors. The activation element 24 serves, on the other hand, to be able to detect an activation action of the user, sensorially.

The module component 100 further comprises:
An electronic device 30 for providing lighting functions as well as sensor functions when the movable part 201 of the vehicle 200 is actuated.

As indicated by FIG. 4, the electronic device 30 is fastened to the support housing 10, in particular immovably relative to the support housing 10.

Furthermore, as can be seen in FIG. 4 and in part in FIGS. 6 and 7, the electronic device comprises, on the one hand, a sensor device 31, 32, in particular integrated in terms of function and circuitry, which is used for presence detection and/or activation action detection on the activation element 24. On the other hand, the electronic device 30 comprises at least one lighting device 33, for example in the form of an LED light source, which is integrated in particular in terms of function and circuitry and is used to illuminate through the key cap 21. The lighting device 33 serves to provide a lighting function on the module component 100, which facilitates the actuation of the movable part 201.

In the scope of the invention, the lighting device 33, together with the sensor device 31, 32 for a presence detection and/or an activation action detection, is functionally as well as circuitry integrated within the electronic device 30. The module component 100, in the sense of the invention, comprises a compact structure and performs not only the sensor functions but also the lighting functions when the movable part 201 is actuated.

The electronic device 30 can, for example, first detect a presence and/or an approach and/or a certain movement pattern of a user. For this purpose, a capacitive sensor device 32 of the electronic device 30 may serve, which is schematically indicated in FIG. 4. In this case, the activation element 24 may act as a capacitive electrode.

Thereafter, the electronic device 30 can initiate an identification check in the sense of the invention (for example, with the aid of an on-board communication device 202, which is schematically indicated in FIGS. 4 and 5) and preferably switch on the lighting device 33 directly or after a positive identification check.

With the lighting device 33 turned on, the user can easily locate the key cap 21 to actuate the key cap 21 and eventually the movable part 201.

For actuating the movable part 201, such as for unlocking and possibly automatically opening the movable part 201, the electronic device 30 in the sense of the invention can transmit corresponding control commands to an on-board control apparatus 203, which is schematically indicated in FIGS. 4 and 5, and/or directly to an on-board lock. The control commands can be transmitted, for example, via a bus B.

As indicated in FIG. 5, the key cap 21 can be arranged, for example, on a grip recess 201M of a movable part without a door handle. The key cap 21 can, for example, be arranged in a concealed manner, but so that it can be sensed by reaching behind into the grip recess 201M. In other cases of use, the key cap 21 may also be arranged in a directly visible manner, for example on a handle, a grip recess, an outer skin or on a component adjacent to the movable part 201, such as a B-pillar of the vehicle 200. When the lighting is on, the key cap 21 may allow light from the lighting device 33 to pass through and exit to the outside. The key cap 21 may also scatter, shape, and/or align the light L from the at least one light source 33 in a particular manner. In the case of a concealed key cap 31, directing the light L in the direction of the grip recess 201M, for example downward toward the roadway, may be advantageous.

As already mentioned above and as can be seen in FIG. 2, the activation element 24 can, for example, be in the form of an electrically conductive platelet, e.g. a thin copper platelet.

The activation element 24 can, for example, have a material thickness of approximately 0.1 mm to 0.5 mm, for example 0.2 mm.

The activation element 24 can be fastened to an inner side 21I of the key cap 21, for example, through a support plate 23. The support plate 23 can have a material thickness of approximately 0.2 to 2 mm, in particular 0.3 to 1.5 mm.

In addition, it is conceivable that activation element 24 can be formed, for example, in the form of an electrically conductive coating, for example, on a support plate 23 or directly on an inner side 21I of the key cap 21.

The activation element 24 can serve as a movable metallic element for an inductance measurement in an inductive sensor device 31, for example in the form of an LDC sensor, for an activation action detection.

Further, the activation element 24 may serve as a capacitive sensing electrode for presence detection in a capacitive sensor device 32 and/or capacitive evaluation electronics 32.

Since the activation element 24 is fastened to the key cap 21, it can be moved with the key cap 21 as a whole and/or with a deformation region on the key cap 21. Movement of the activation element 24 relative to the sensor device 31, 32 causes a measurable change in inductance in the sensor device 31, 32.

As shown in FIGS. 6 and 7, the key cap 21 can be supported, in particular from an outer side 10A of the support housing 10, on the support housing 10, in particular movably relative to the support housing 10, and that the electronic device 30 can be fastened, in particular from an inner side 10I of the support housing 10, to the support housing 10, in particular immovably relative to the support housing, in such a way that an air chamber K is formed between the key cap 21 and the electronic device 30.

The air chamber K is closed off and in particular sealed by the attachment of the key cap 21 on the one hand and the electronic device 30 on the other hand to the support housing 10. The sealing element 22 can be used for sealing from the outside (cf. FIG. 2). For sealing from the inside, a potting compound can be used for potting the electronic device 30.

In the air chamber K, the light L from the at least one lighting device 33 can propagate before it enters the key cap 21, is guided through it, possibly shaped and/or scattered and/or aligned, and exits the key cap 21 to the outside with respect to the air chamber K. In this way, a protected mounting of the at least one lighting device can be made possible. Also, lighting functions with improved, individually adjustable properties can thereby be provided.

From FIGS. 6 and 7, it can be seen that the activation element 24 is positioned between the key cap 21 and the electronic device 30. The activation element 24 comprises corresponding through holes 24A for each lighting device 33 (see also FIGS. 2 and 4), in order to allow the light L from the at least one lighting device to illuminate through the key cap 21 unobstructed.

Advantageously, a plurality of activation elements 24, for example two activation elements 24, may be arranged on the key cap 21 to be able to detect the activation action of the user. In this way, the activation elements 24 can be configured without through holes 24A for the lighting devices 33.

It is further apparent from FIGS. 6 and 7 that the activation element 24 is arranged apart from the electronic device 30. The spacing between the activation element 24 and the electronic device 30 may allow for relative movement of the activation element 24 with respect to the electronic device 30, which may serve to change inductance, for example in at least one LDC sensor, to detect an activation action.

As can be seen in FIG. 2, the activation element 24 may be completely electrically isolated from the fastening of the key cap 21 and/or the electronic device 30 to the support housing 10.

In FIG. 4, it is indicated that the electronic device 30 may include a free-standing, resilient and/or flexible contact element 34, for example in the form of a leaf spring contact, which may serve to electrically contact the activation element 24 when the electronic device 30 and the key cap 21 are fastened to the support housing 10.

After fastening the key cap 21 and the electronic device 30 to the support housing 10, the activation element 24 comes to rest resiliently on the free-standing contact element 34, for example in the form of a leaf spring contact, of the electronic device 30 and thus contacts the electronic device 20, in particular a capacitive evaluation device 32 of the electronic device 20. The contacting of the activation element 24 with the capacitive evaluation device 32 can preferably serve for presence detection.

In FIGS. 6 and 7, it is further indicated that the key cap 21 can comprise, on an inner side 21I facing the electronic device 30, a lens structure 21L that is, in particular, integrally formed, for example, co-molded, ablated or applied. Through the lens structure 21I, the light L from the at least one lighting device 33 can be influenced, for example scattered, directed and/or aligned, and thus shaped as desired and/or required. For example, it is conceivable that the lens structure 21L can comprise a serrated structure and/or grooved structure and/or cam structure.

As indicated by FIG. 5, the lens structure 21L may be configured to scatter, direct and/or align the light L from the at least one lighting device 33, in particular in a direction towards a grip recess 201M on the movable part 201 of the vehicle 200.

Furthermore, FIGS. 6 and 7 indicate that the key cap 21 can comprise, on an outer side 21A facing away from the electronic device 30, a rough structure 21R, in particular integrally formed, for example co-molded, ablated or applied, in order to scatter the light L, which may have previously been diffusely scattered by the lens structure 21L and guided through the key cap 21, again as it emerges from the key cap 21. In this way, pleasant ambient lighting, for example of a grip recess, can be provided.

The rough structure 21R can be produced, for example, by roughening the outer side 21A of the key cap 21.

The rough structure 21R may not only scatter the light L from the at least one lighting device 33, but also provide a haptic tactile sensation for better haptic location of the key cap 21, especially when, felt in a grip recess.

Further, FIGS. 5 to 7 show that in an unactuated position, the key cap 21 is supported on the support housing 10 such that an outer side 21A of the key cap 21 extends substantially flush with or slightly protruding (for example, in the range of a few micrometers to a few millimeters) from an outer side 10A of the support housing 10.

In addition, FIGS. 5 to 7 show that the key cap 21 is supported on the support housing 10 in an unactuated position such that a circumferential gap S is formed between an outer side 21A of the key cap 21 and an outer side 10A of the support housing 10 peripherally of the key cap 21.

The area of the circumferential gap S can preferably be filled by a sealing element 22, in particular by a folding region 22f of the sealing element 20 (cf. FIG. 5), in order to seal the opening 11 in the support housing 10 and in particular to protect the electronic device 30 from the effects of the weather, in particular from moisture.

In principle, it is conceivable within the scope of the invention that the sensor device 31, 32 can comprise at least one or more inductive sensor devices 31, e.g. in the form of LDC sensors, arranged symmetrically to one another (cf. FIG. 4) for detecting an activation action. With the aid of inductive LDC sensors, the smallest movements in the range of a few micrometers to a few millimeters can be detected.

In addition, the sensor device 31, 32 can comprise a capacitive sensor device 32 and/or a capacitive evaluation device 32 for presence detection at the activation element 24. With the help of capacitive sensor devices, a presence detection in the range of several meters up to several hundred meters can be detected.

The electronic device 30 comprises a control device 35 (cf. FIG. 4), which can preferably form part of an access system to the vehicle 200, for example in the form of a keyless go and/or a keyless entry system. The control device can advantageously be operatively connected to a control apparatus 203 or directly to a lock of the vehicle 200 in terms of control technology and/or communication technology, for example via a bus B. For the purpose of an identification check, the control device can be operatively connected to an on-board communication device 202, for example in the form of a radio device or an NFC device, in terms of control technology and/or communication technology, for example via a bus B, in order to verify an authorization, for example in the form of an ID code, of the user.

The control device 35 may, for example, after a positive presence detection and/or a positive identification check of the user at the activation element 24, turn on an illumination of the key cap 21 to facilitate locating the key cap 21.

As indicated by FIGS. 3, 4 and 5, an opening 11 for the key device 20 may be provided on the support housing 10, through which inductive detection of an activation action may advantageously be performed.

As indicated by FIGS. 3 and 4, the support housing 10 may include a trough-shaped seat 12 for the key device 20. The opening 11 may be formed at a bottom of the trough-shaped seat 12.

As shown in FIGS. 3, 4 and 6, the support housing 10 can have a frame structure 13 for the electronic device 30, in particular on an inner side 10I. The frame structure 13 may peripherally enclose the opening 11 and in particular the key device 20, and in particular serve as a potting tray for potting the electronic device 30. The frame structure 13 may further serve to guide and/or fasten a cable guide 13B for a bus B.

As mentioned above, the electronic device 30 may be arranged from an inner side 10I of the support housing 10 on the support housing 10, in particular at an opening 11 in the support housing 10, preferably behind the key cap 21, and/or may be potted with a potting compound to fasten and/or seal the electronic device 30.

As mentioned above, a sealing element 22 may be arranged on the key cap 21 to seal an opening 11 in the support housing 10 and, in particular, to protect the electronic device 30 from the effects of the weather.

The sealing element 22 may also be configured to fix the key cap 21 to the support housing 10, preferably to an opening 11 in the support housing 10, in particular by a laser welding process, and/or to fasten and/or support it in a movable manner, in particular by compressibility of the sealing element 22, so that it can be pressed in at least slightly.

According to a particular advantage, the sealing element 22 may be configured to allow a volume compensation, in particular in an air chamber K, between the key cap 21 and the electronic device 30.

As indicated by FIG. 2 and FIGS. 5 to 7, the sealing element 22 may comprise a fastening region 22b, in particular on a shoulder region which is preferably radially on the outside and/or in the form of a collar, in order to fasten the key cap 21 to the support housing 10, in particular in a material bonded contact, preferably by laser welding. The fastening region 22b can preferably be configured to be compressible in order to allow movement of the key cap 21 relative to the support housing 10.

Furthermore, FIG. 2 and FIGS. 5 to 7 indicate that the sealing element 22 may comprise a folding region 22f to allow movement of the key cap 21 relative to the support housing 10. Furthermore, the folding region 22f may be configured to allow volume compensation, in particular in an air chamber K, between the key cap 21 and the electronic device 30. The folding region 22f may comprise at least one, in particular substantially U-shaped, Ω-shaped and/or S-shaped, fold and/or be bellows-shaped. The folding region 22f may, for example, be drawn into the chamber in the event of a volume reduction in the air chamber K, and/or compressed in the chamber and/or displaced from the chamber in the event of a volume increase in the air chamber K.

Furthermore, as can be seen in FIG. 2 and in FIGS. 6 and 7, the sealing element 22 can comprise a support region 22s, in particular on a radially inner side, in order to fasten the sealing element 22 to the key cap 21, in particular in a material-locking manner, preferably by a 2-component injection molding process. Advantageously, the support region 22s can be configured to allow volume compensation, in particular in an air chamber K, between the key cap 21 and the electronic device 30.

The key cap 21 and the sealing element 22 can be configured as a 2-component injection-molded component. In this case, the key cap 21 and the sealing element 22 or the seal element 22, preferably at a fastening region 22b, can be fastened to the support housing 10 by material bonding, in particular by laser welding, in order to fasten the key device 20 to the support housing 10.

As shown in FIGS. 1 and 2, the key cap 21 may comprise at least one, in particular hook-shaped or claw-shaped, fastening element 21b for the activation element 24, in particular for a support plate 23 for the activation element 24. The at least one fastening element 21b may serve for fastening the activation element 24 to the key cap 21, for example by hot caulking or ultrasonic welding of the at least one fastening element 21b. In this way, the activation element 24 can be fastened at a distance from the inner side 21I of the key cap 21.

A method according to the invention for manufacturing a module component 100 for a movable part 201 of a vehicle 200 comprises the following steps/stages:

Providing a support housing 10 for fastening the module component 100 to the movable part 201 of the vehicle 200, and in particular for movably supporting a key device 20 and preferably for fastening an electronic device 30 (cf. FIGS. 3 to 7), Providing a key device 20 for actuating the movable part 201 of the vehicle 200 with a, in particular transparent, key cap 21 and an, in particular electrically conductive, activation element 24 (cf. FIGS. 1 and 2), supporting, for example movably supporting, the key cap 21, in particular from the outside meaning the area of accessibility for the user, when the module component 100 is mounted on the vehicle 200, on the support housing 10 for receiving an activation action, in particular a touch and/or an exertion of force, of a user (cf. FIG. 3), providing an electronic device 30 for providing lighting functions and/or sensor functions when the movable part 201 of the vehicle 200 is actuated, comprising a sensor device 31, 32 for presence detection and/or activation action detection on the activation element 24 and at least one lighting device 33 for illuminating through the key cap 21 (cf. the FIG. 4), fastening of an electronic device 30, in particular from the inside meaning the area that is inaccessible to the user when the module component is mounted on the vehicle, to the support housing 10 (cf. FIG. 4).

The activation element 24 may be fastened to the key cap 21, for example by hot caulking or ultrasonic welding, before or after the key cap 21 is supported on the support housing 10.

The foregoing explanation of the embodiments describes the present invention exclusively in the context of examples. Of course, individual features of the embodiments may be freely combined with one another, provided that this is technically expedient, without departing from the scope of the present invention.

LIST OF REFERENCE SIGNS

200 Vehicle
201 Movable part
201M Grip recess
202 Communication device
203 Control apparatus
100 Module component
10 Support housing
10A Outer side
10I Inner side
11 Opening
12 Seat
13 Frame structure
13B Cable guide
20 Key device
21 Key cap
21A Outer side
21I Inner side
21L Lens structure
21R Rough structure
21b Fastening element
22 Sealing element
22b Fastening region
22f Folding region
22s Support region
23 Support plate
24 Activation element
24A Through hole
30 Electronic device
31, 32 Sensor device
31 inductive sensor device
32 capacitive sensor device and/or capacitive evaluation electronics
33 Lighting device
34 Contact element
35 Control device
B Bus
K Air chamber
L Light

The invention claimed is:

1. A module component for a movable part of a vehicle, the module component comprising:
 a support housing for fastening the module component to the movable part of the vehicle,
 a key device for actuating the movable part of the vehicle, wherein the key device comprises a key cap configured to receive an activation action of a user,
 wherein an activation element is arranged on the key cap to be able to detect at least a presence or an activation action of the user,
 and an electronic device for providing at least lighting functions or sensor functions when the movable part of the vehicle is actuated,
 wherein the sensor functions of the electronic device are provided by a sensor device for at least a presence detection or an activation action detection at the activation element,
 wherein the lighting functions of the electronic device are provided by at least one lighting device for illuminating through the key cap; and
 wherein the electronic device is fastened to the support housing.

2. The module component according to claim 1, at least wherein
 the activation element at least comprises an electrically conductive material or is configured in the form of an electrically conductive platelet or an electrically conductive coating on an inner side of the key cap,
 or wherein the key cap comprises at least one deformation region in order to be able to receive an activation action,
 or wherein the activation element is arranged on at least one deformation region of the key cap,
 or wherein the activation element is fastened to the key cap to be moved with at least the key cap
 or at least one deformation region on the key cap and to cause a measurable inductance change in the sensor device by a movement of the activation element relative to the sensor device,
 or wherein the activation element is configured at least for activation action detection or for presence detection with the aid of the sensor device.

3. The module component according to claim 1, wherein
 the key cap is supported on the support housing
 and that the electronic device is fastened to the support housing in such a way,
 that an air chamber is formed between the key cap and the electronic device,
 and at least that the at least one lighting device, comprising at least one or more light elements can emit a light into the air chamber which passes through key cap,
 or that the at least one lighting device comprises at least one or more lighting elements.

4. The module component according to claim 1, at least wherein
 the activation element is positioned between the key cap and the electronic device,
 or wherein the activation element comprises a corresponding through hole for the at least one lighting device,
 to transmit a light of the at least one lighting device for illuminating through the key cap,
 or wherein two activation elements are arranged on the key cap in order to be able to detect the activation action of the user.

5. The module component according to claim 1, at least wherein
 the activation element is fastened to the key cap in such a way that the activation element is arranged at a distance from the electronic device,
 or wherein at least the activation element of the fastening of the key cap or of the electronic device at the support housing is galvanically isolated from the electronic device,
 or wherein the electronic device comprises at least a free-standing, resilient or flexible contact element, for making electrical contact with the activation element,
 or wherein the activation element, after the fastening of the key cap and the electronic device to the support housing, comes to rest resiliently on a free-standing contact element, of the electronic device.

6. The module component according to claim 1, at least wherein
the key cap comprises, on an inner side facing the electronic device, a lens structure,
or wherein
the key cap comprises, on an outer side facing away from the electronic device, a rough structure.

7. The module component according to claim 1, at least wherein
the key cap is supported on the support housing such that an outer side of the key cap extends substantially flush with or protruding from an outer side of the support housing,
or wherein the key cap is supported on the support housing in such a way that a circumferential gap is formed between an outer side of the key cap and an outer side of the support housing peripherally of the key cap.

8. The module component according to claim 1, wherein
the sensor device comprises at least one or more inductive sensor devices,, for at least an activation action detection or a capacitive sensor device or a capacitive evaluation device for a presence detection at the activation element.

9. The module component according to claim 1, wherein
the electronic device comprises a control device.

10. The module component according to claim 1, at least wherein
the control device is configured to detect a presence of the user at the activation element through at least a capacitive sensor device or a capacitive evaluation device,
or wherein the control device is configured to activate the on-board communication device, in order to carry out an identification check between an on-board communication device and an ID transmitter,
or wherein the control device is configured to detect, after a positive identification check, an activation action of the user at the activation element by at least one inductive sensor device,
or wherein the control device is configured to switch on an illumination of the key cap, in order to make it easier to find the key cap,
or wherein the control device is configured to initiate actuation of the movable part of the vehicle, after an activation action detection of the user at the activation element.

11. The module component according to claim 1, at least wherein
the support housing comprises an opening for the key device,
or wherein the support housing comprises a trough-shaped seat for the key device,
or wherein the key cap is supported by an outer side of the support housing on the support housing,
or wherein the support housing comprises at least positioning aids or centering aids for the key cap.

12. The module component according to claim 1, at least wherein
the support housing comprises a frame structure for the electronic device,
or wherein the electronic device at least is arranged from an inner side of the support housing on the support housing or is potted with a potting compound in order to at least fasten or seal the electronic device,
or wherein the support housing comprises at least positioning aids or centering aids for the electronic device.

13. The module component according claim 1, at least wherein
the support housing is an injection molded component,
or wherein the support housing comprises a dimensionally stable material,
or wherein
the key cap comprises at least a dimensionally stable or transparent material.

14. The module component according to claim 1, wherein
the key cap at least comprises at least one positioning aid or centering aid for the activation element,
wherein the key cap comprises at least one fastening element for the activation element.

15. A method of manufacturing a module component, according to claim 1, for a movable part of a vehicle, showing:
Providing a support housing for fastening the module component to the movable part of the vehicle,
Providing a key device for actuating the movable part of the vehicle with a key cap and an activation element,
Supporting the key cap on the support housing for receiving an activation action of a user,
providing an electronic device for providing at least lighting functions or sensor functions when the movable part of the vehicle is actuated, comprising a sensor device at least for presence detection or activation action detection on the activation element and at least one lighting device for illuminating through the key cap,
Fastening an electronic device to the support housing.

16. The method according to claim 15, at least wherein
the support housing is manufactured by an injection molding process,
or wherein the support housing is molded from a dimensionally stable material,
or wherein
the activation element is fastened to the key cap.

17. The method according to claim 15, wherein
the electronic device at least is arranged from an inner side of the support housing on the support housing, or is potted with a potting compound in order to at least fasten or seal the electronic device.

18. The method according to claim 15, wherein
the key cap is supported on the support housing
and that the electronic device is fastened to the support housing in such a way,
that an air chamber is formed between the key cap and the electronic device,
and in that the at least one lighting device, comprising at least one or more light elements, can emit a light into the air chamber which passes through key cap.

19. The method according to claim 15, wherein
the key cap is provided with an integral lens structure on an inner side facing the electronic device.

20. The method according to claim 15, wherein the key cap is provided with an integral rough structure on an outer side facing away from the electronic device, in order to at least scatter a light from the at least one lighting device or to produce a haptic tactile sensation for improved location of the key cap when the movable part of the vehicle is actuated.

* * * * *